United States Patent
Thoener

(10) Patent No.: US 11,491,543 B2
(45) Date of Patent: Nov. 8, 2022

(54) METHOD FOR PRODUCING AN NB₃SN SUPERCONDUCTOR WIRE

(71) Applicant: Bruker EAS GmbH, Hanau (DE)

(72) Inventor: Manfred Thoener, Biebergemuend (DE)

(73) Assignee: Bruker EAS GmbH, Hanau (DE)

( * ) Notice: Subject to any disclaimer, the term of this patent is extended or adjusted under 35 U.S.C. 154(b) by 574 days.

(21) Appl. No.: 16/571,216

(22) Filed: Sep. 16, 2019

(65) Prior Publication Data
US 2020/0108447 A1 Apr. 9, 2020

Related U.S. Application Data

(63) Continuation of application No. 14/198,618, filed on Mar. 6, 2014, now abandoned, and a continuation of application No. 15/361,541, filed on Nov. 28, 2016, now abandoned.

(30) Foreign Application Priority Data

Mar. 14, 2013 (EP) .................................... 13159230

(51) Int. Cl.
| | |
|---|---|
| *B22F 5/12* | (2006.01) |
| *H01L 39/24* | (2006.01) |
| *B22F 1/00* | (2022.01) |
| *B22F 3/20* | (2006.01) |
| *B22F 7/04* | (2006.01) |
| *C22C 13/00* | (2006.01) |
| *C22C 30/02* | (2006.01) |
| *H01F 6/06* | (2006.01) |

(Continued)

(52) U.S. Cl.
CPC .............. *B22F 5/12* (2013.01); *B22F 1/0003* (2013.01); *B22F 3/20* (2013.01); *B22F 7/04* (2013.01); *C22C 13/00* (2013.01); *C22C 30/02* (2013.01); *H01F 6/06* (2013.01); *H01F 41/048* (2013.01); *H01L 39/12* (2013.01); *H01L 39/2403* (2013.01); *H01L 39/2409* (2013.01); *B22F 2301/20* (2013.01); *B22F 2301/30* (2013.01); *B22F 2303/01* (2013.01); *B22F 2998/10* (2013.01); *Y10T 29/49014* (2015.01); *Y10T 428/12076* (2015.01)

(58) Field of Classification Search
CPC ...... B22F 5/12; B22F 3/20; B22F 7/04; B22F 1/0003
See application file for complete search history.

(56) References Cited

U.S. PATENT DOCUMENTS

| | | | | |
|---|---|---|---|---|
| 2008/0188372 A1* | 8/2008 | Motowidlo | ......... | H01L 39/2409 505/231 |
| 2008/0274903 A1* | 11/2008 | Field | .................... | H01L 39/2409 29/599 |

* cited by examiner

*Primary Examiner* — Paul A Wartalowicz
(74) *Attorney, Agent, or Firm* — Paul Vincent

(57) ABSTRACT

A method for the production of a superconducting wire (20) uses a monofilament (1) having a powder core (3) that contains at least Sn and Cu, an inner tube (2), made of Nb or an alloy containing Nb, that encloses the powder core (3), and an outer tube (4) in which the inner tube (2) is arranged. The outer side of the inner tube (2) is in contact with the inner side of the outer tube (4) and the outer tube (4) is produced from Nb or from an alloy containing Nb. The outer tube is disposed in a cladding tube. The superconducting current carrying capacity of the superconducting wire is thereby improved.

13 Claims, 5 Drawing Sheets

(51) Int. Cl.
*H01F 41/04* (2006.01)
*H01L 39/12* (2006.01)

METHOD FOR PRODUCING AN NB₃SN SUPERCONDUCTOR WIRE

This application is a continuation of Ser. No. 15/361,541 filed Nov. 28, 2016, wherein that Ser. No. 15/361,541 application was a continuation of Ser. No. 14/198,618 filed Mar. 6, 2014. The instant application also claims Paris convention priority from EP 13 159 230.5, filed on Mar. 14, 2013. The entire disclosures of all the above cited applications are hereby incorporated by reference.

BACKGROUND OF THE INVENTION

The invention concerns a method for the production of a superconducting wire using a monofilament, the monofilament comprising:

a powder core that contains at least Sn and Cu,
an inner tube that encloses the powder core,
an outer tube in which the inner tube is arranged, wherein the outer side of the inner tube is in contact with the inner side of the outer tube, and wherein the outer tube is made from Nb or an alloy containing Nb, and
a cladding tube in which the outer tube is arranged.

A monofilament of this type is disclosed by EP 0 169 596 A1.

Nb₃Sn is a widely used superconducting material, in particular, for the production of superconducting magnet coils. In comparison with other metallic low-temperature superconducting materials (such as NbTi), Nb₃Sn superconducting wires achieve technically relevant current densities in higher magnetic fields. However, the production and processing of Nb₃Sn superconducting wires is difficult, since Nb₃Sn is a relatively brittle material and can therefore not be plastically deformed (or only to a minimum extent).

Nb₃Sn wires are usually produced in accordance with the bronze route, the internal tin diffusion technology, or the powder-in-tube technology (PIT). In all three cases, the production is divided into semi-finished product manufacture on the one hand and reaction annealing on the other hand. Brittle Nb₃Sn is generated only during reaction annealing. Deformation of the superconducting wire is normally not carried out after reaction annealing.

With respect to powder-in-tube technology, as disclosed e.g. by EP 0 169 596 A1, a powder mixture containing Sn is disposed in an inner tube, which is normally made of copper, and the inner tube is, in turn, introduced into an outer tube, which is normally made of Nb. The outer tube is, in turn, arranged in a round conductive matrix tube (cladding tube), which is normally made of Cu. A plurality of these monofilaments can be bundled. Due to reaction annealing, during which Sn from the powder mixture reacts with Nb from the outer tube to form Nb₃Sn with the catalytic assistance of Cu from the inner tube or as an additive to the powder mixture, one obtains a superconducting wire with high superconducting current carrying capacity using that powder-in-tube technology.

H. Veringa et al., Adv. Cryo. Eng. (Materials), 1984; 30, pages 813-821 disclose a superconducting wire, wherein NbSn₂ powder with addition of Cu is introduced into an Nb tube, the Nb tube is introduced into a hexagonal copper tube, and several copper tubes filled in this fashion are arranged in a bundling tube of copper and are temperature-controlled after extrusion and drawing. A similar procedure is also disclosed by A.C.A. van Wees et al., IEEE Trans. Magn., MAG 19, 556 (1983), pages 5-8.

It is the object of the present invention to further increase the superconducting current carrying capacity of the superconducting wire.

SUMMARY OF THE INVENTION

This object is achieved by a method for producing a superconducting wire using a monofilament of the abovementioned type, and having an inner tube made of Nb or an alloy containing Nb. The method comprises the steps of:
a) filling the powder core into the inner tube;
b) drawing, following step a), the inner tube, thereby compacting the powder core;
c) inserting the outer tube into the cladding tube; and
d) inserting, following step b), the drawn, filled inner tube into the outer tube, wherein step c) is performed prior to or after step d).

Due to the fact that the inner tube is produced from Nb or an alloy containing Nb, one obtains a finer and more homogeneous structure of Nb₃Sn grains after reaction annealing, in particular, in the area of the previous boundary surface between the inner tube and the powder core compared with the use of an inner tube of copper. Cavities (e.g. gaps) in this area are also prevented or at least reduced after reaction annealing. Both result in a significant increase in the superconducting current carrying capacity of the finished superconducting wire. The inventors have observed an increase in the critical current density by a factor of 1.5 to 2.

The reaction front of Nb₃Sn that advances to the outside is moreover easier to control during reaction annealing. In particular, breakthroughs of the reaction front into the cladding tube (matrix) and consequently contamination of the cladding tube (which is made of Cu in most cases) can be easily prevented. In correspondence therewith, the residual resistance of the cladding tube can be kept low (or the RRR value can be kept high).

The use of an inner tube of Nb or an alloy containing Nb surprisingly did not entail noticeable problems with the deformation behavior, e.g. during drawing of the filled inner tube only, during drawing of the monofilament or during drawing of a precursor of a superconducting wire with several drawn monofilaments. In particular, there was no increase in filament breakage in the reacted superconducting wire.

The powder core contained in the inner tube can be well compacted by the inner tube in a drawing process prior to insertion into the outer tube. The main part of the niobium required to form Nb₃Sn can be provided by the outer tube such that the inner tube can be designed to have relatively thin walls.

The inner tube typically has an Nb content of at least 80 weight %, preferably at least 90 weight %. The inner tube is moreover typically free of copper. The same applies to the outer tube. The powder core typically contains a mixture of different powders of different compositions, inter alia Cu which is required to accelerate formation of Nb₃Sn. Cu is preferably present in elementary form whereas Sn is generally present at least partially in the form of an alloy (preferably alloyed with Nb).

In one particularly advantageous embodiment of the inventive monofilament, the cladding tube has a hexagonal outer cross-section and a round inner cross-section. In this case, an outer tube having a round outer cross-section (and round inner cross-section) can be inserted, the outer cross-section of which does not have to be changed within the scope of bundling processes. It is, in particular, no longer necessary to impress a hexagonal outer cross-section onto the cladding tube in a drawing step of the monofilament, which would also result in an approximately hexagonal outer cross-section of the previously round outer tube (the inner cross-section would remain substantially round). For this reason, the outer tube can maintain a uniform wall thickness, in particular, also at the beginning of reaction annealing. $Nb_3Sn$ can then be uniformly formed from the inside into the outer tube without fear of premature breakthrough of Sn into the cladding tube at a thin point, and no unreacted corner areas remain. A particularly large portion of the cross-sectional area of the monofilament can correspondingly react to $Nb_3Sn$ which is then available for the superconducting current transport. Since the reacted volume of $Nb_3Sn$ can moreover transport a relatively high current density due to its fine structure, the advantages of the invention exponentiate in this embodiment to yield a particularly high current carrying capacity for each monofilament or for the overall superconducting wire. As an alternative to this embodiment, the cladding tube may also have a round outer cross-section. For subsequent bundling, it is then necessary to impress a hexagonal outer cross-section in a drawing step.

In accordance with the invention, the inner tube has a round inner cross-section and a round outer cross-section and the outer tube has a round inner cross-section and a round outer cross-section. In this case, the reaction of Sn with Nb to $Nb_3Sn$ may be performed particularly evenly, in particular with a (circular) round reaction front in the monofilament.

In a preferred further development of this inventive feature, the following applies:

$$1.2 \leq D^{outside}_{outertube}/D^{outside}_{innertube} \leq 2.0$$

with $D^{outside}_{outertube}$: outer diameter of the outer tube and $D^{outside}_{innertube}$: outer diameter of the inner tube.

The inventive method also specifies that $4 \leq W_{outertube}/W_{innertube} \leq 50$, with $W_{outertube}$: Wall thickness outer tube and $W_{innertube}$: Wall thickness inner tube. These ranges of diameter ratios and wall thickness ratios have turned out to be advantageous in practice. In particular, there was no increase in filament breakage in the reacted superconducting wire.

In another advantageous embodiment, the powder core has a content of 2 weight % to 12 weight % of Cu, preferably 3 to 9 weight % of Cu, wherein the powder core preferably contains elementary Cu powder. The Cu addition in the powder core has a catalytic effect for the formation of $Nb_3Sn$ and reduces the reaction temperature. In practice, a copper content in the powder core of up to 5 weight % is often already sufficient to achieve an efficient reaction. Due to the omission of an inner tube of copper, the overall copper content in the reaction area of the monofilament can be selected relatively freely, in particular, to be lower than if an inner tube of copper were used. Distribution of copper in the reaction area, in particular uniformly in the powder core, is moreover also improved.

In another preferred embodiment, the powder core is compacted in the inner tube, in particular with a density of at least 40%, preferably at least 50% of the theoretical density. The compaction can, in particular, be realized by a drawing process of the filled inner tube prior to insertion into the outer tube. The (pre)compaction improves the overall plastic deformability of the finished conductor (precursor of the superconducting wire) prior to reaction annealing.

In one preferred embodiment, the powder core contains $NbSn_2$ and/or $Nb_6Sn_5$ and/or elementary Sn. These materials can be well used as tin sources within the scope of the present invention. In most cases, a combination of two or also of all three materials is used.

In another advantageous embodiment, the inner tube and/or the outer tube are produced from an alloy containing Nb and containing Ta and/or Ti, in particular, with a summed content of at least 0.5 weight % of Ta and/or Ti, and in particular, with a summed content of maximally 10 weight % of Ta and/or Ti. Small additions of tantalum and/or titanium have a positive influence on the forming kinetics and on the structure of $Nb_3Sn$ and increase the achievable critical current density. In accordance with this embodiment, the overall additions of tantalum and titanium should preferably maximally amount to 10 weight % in order to avoid undesired phases. Hf or Zr could also be used as alloy additions.

In another preferred embodiment, the inner tube and the outer tube are produced from different materials. The inner and outer tubes can consequently be designed to have different properties. The inner tube may, in particular, be selected through suitable composition and/or structural adjustment such that the outer side of the inner tube is minimally deformed during filling in the powder core and during a drawing process in order to facilitate subsequent insertion into the outer tube. The outer tube can e.g. consist of NbTa7.5 and the inner tube of Nb. The materials of the inner tube and of the outer tube could alternatively also be selected to be the same.

In another advantageous embodiment, the cladding tube is made of Cu. Copper has high conductivity and can therefore protect the $Nb_3Sn$ filament as a parallel current path close to it in case of a quench (loss of superconductivity).

In accordance with the present invention, step b) is preferably performed prior to step c). The undrawn inner tube preferably has thin walls, e.g. with a ratio between wall thickness and outer diameter of ⅕₂₅ to ⅙₀, thereby achieving particularly high compaction of the powder core in step a).

In one particularly advantageous variant of the inventive method for producing a monofilament, the cladding tube already has a hexagonal outer cross-section prior to step b). For this reason, bundling of the monofilaments does not require drawing to obtain a hexagonal outer cross-section and the outer tube can remain round inside and outside. A large portion of the cross-section of each monofilament can be used for forming $Nb_3Sn$ having a very homogeneous and fine structure. This leads to particularly high superconducting current carrying capacities (see above).

The present invention also concerns a method for producing a precursor of a superconducting wire, characterized by the following steps:

e) drawn monofilaments having a hexagonal outer cross-section are produced by drawing one or more inventive monofilaments;

f) a plurality of drawn monofilaments are bundled in a wire cladding tube;

g) the wire cladding tube that contains the bundled and drawn monofilaments, is extruded and/or drawn, thereby obtaining the precursor of the superconducting wire. The contact between the inner tube and the outer tube can be improved by the drawing step according to e) (in particular, any gaps can be closed) and further compaction can be achieved such that more monofilaments can be bundled in step f). The size of the monofilaments and, if required, the shape of the monofilaments can be adjusted for step f). The precursor of the superconducting wire is given the size and cross-sectional shape required for the application (e.g. a magnet coil to be wound) in step g). The wire cladding tube is typically produced of Cu in order to ensure a low residual resistance.

In one variant of the inventive method of producing a precursor of a superconducting wire, in step e) the monofilament(s) already has/have a hexagonal outer cross-section of the cladding tube and a round outer cross-section of the outer tube prior to drawing, and the drawn monofilaments also have a hexagonal outer cross-section of the cladding tube and a round outer cross-section of the outer tube after drawing. The monofilaments are thus merely "radially compressed" during drawing in step e). This is particularly simple and prevents an outer shape change of the cladding tube from also being impressed inside, e.g. on the outer tube.

A superconducting wire using the precursor in accordance with the invention has a particularly high current carrying capacity.

The invention is directed to a method for producing a superconducting wire from an inventive precursor of a superconducting wire as described above, characterized by the following steps:

h) the precursor of the superconducting wire is mechanically deformed, in particular, wound to form a coil;

i) the deformed precursor of the superconducting wire is temperature-treated, in particular at a maximum temperature of 700° C. or less, wherein Nb from the inner tube and the outer tube reacts with Sn from the powder core to form $Nb_3Sn$. The superconducting wire produced in this fashion can achieve a particularly high superconducting current carrying capacity. In step h), the precursor is brought into a form desired for the required application (which cannot be changed again after reaction annealing in step i)). Temperature treatment is subsequently performed in this form in accordance with step i). Typical applications are magnet coils, in particular for spectroscopic NMR apparatus and imaging MRI apparatus.

In one preferred variant of the inventive method of producing a superconducting wire, temperature treatment is terminated in step i) before a reaction front that advances to the outside has reached the boundary surface between the outer tube and the cladding tube. This prevents introduction of impurities into the cladding tubes of the contained monofilaments such that the residual resistance of the cladding tubes can be kept low. In case of a quench, the cladding tubes then provide powerful current paths parallel to the $Nb_3Sn$ filaments to protect the superconducting wire from burning through. Since advance of the reaction front during temperature treatment is relatively uniform, it is easy to find a suitable point in time for cooling in order to terminate the reaction advance for different wire geometries by means of a few tests with different annealing periods. The reaction fronts can be easily recognized e.g. in cross-section via a scanning electron microscope.

The superconducting wire produced in accordance with the invention has a particularly high current carrying capacity.

Further advantages of the invention can be extracted from the description and the drawing. The features mentioned above and below may be used in accordance with the invention either individually or collectively in arbitrary combination. The embodiments shown and described are not to be understood as exhaustive enumeration, rather have exemplary character for describing the invention.

The invention is illustrated in the drawing and is explained in more detail with reference to embodiments. In the drawing:

DESCRIPTION OF THE PREFERRED EMBODIMENT

Figure 1:
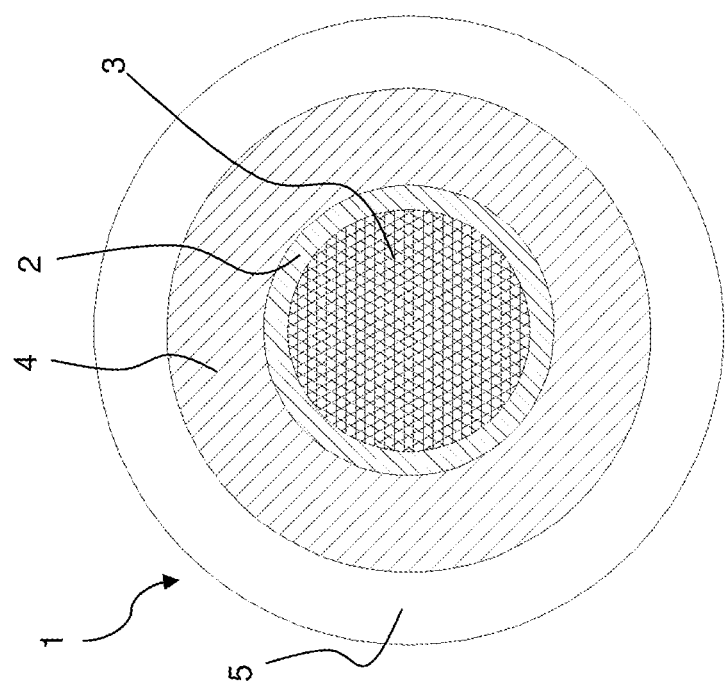
FIG. 1 shows a schematic cross-sectional view of a first embodiment of an inventive monofilament with hexagonal cladding tube.

FIG. 1 schematically shows a first embodiment of an inventive monofilament 1 in cross-section perpendicular to its longitudinal direction.

The monofilament 1 has an inner tube 2 which consists of niobium in the illustrated embodiment. A powder core 3 of a mixture of, in the present case, $NbSn_2$ powder, Sn powder and Cu powder is disposed in the inner tube 2. The content of Cu in the mixture is approximately 5 weight % and the content of Sn in the mixture is typically at least 50 weight %.

The inner tube 2 is arranged in an outer tube 4 which consists of NbTa7.5 in the present case. The outer side of the inner tube 2 thereby directly abuts the inner wall of the outer tube 4. The inner tube 2 and the outer tube 4 each have (circular) round inner and outer cross-sections.

The outer tube 4 is, in turn, arranged in a cladding tube 5 which consists of elementary copper in the present case. The cladding tube 5 has a round inner cross-section in the illustrated embodiment such that the outer tube 4 abuts the cladding tube 5 over the whole surface. The outer cross-section of the cladding tube 5 is hexagonal ("hexagonal tube"), thereby increasing the area portion of the finished superconducting wire that can be utilized for $Nb_3Sn$.

The main source of Nb for the reaction heat treatment is the outer tube 4. The inner tube 2 enables good compaction of the powder core 3 in a previous drawing step (see also FIG. 4 in this context) due to its comparatively thin wall. By way of example, the ratio VD between the outer diameter $D^{outside}_{outertube}$ of the outer tube 4 and the outer diameter $D^{outside}_{innertube}$ of the inner tube 2 is approximately 1.65 in the embodiment shown. The ratio VW between the wall thickness $W_{outertube}$ of the outer tube 4 and the wall thickness $W_{innertube}$ of the inner tube 2 is moreover approximately 4.2. The inner tube 2, the outer tube 4 and the cladding tube 5 are arranged concentrically. No solder is required for the monofilament 1.

Figure 2:
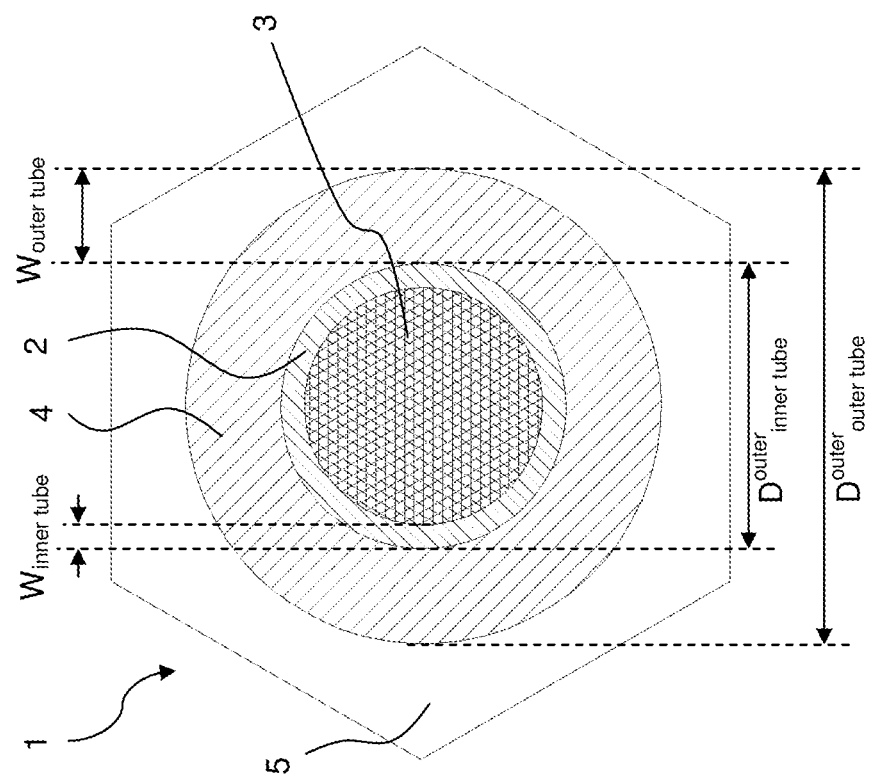
FIG. 2 shows a schematic cross-sectional view of a second embodiment of an inventive monofilament with round cladding tube.

FIG. 2 schematically shows a second embodiment of an inventive monofilament 1 in cross-section perpendicular to its longitudinal extension.

The second embodiment of the monofilament 1 largely resembles the embodiment of FIG. 1, in particular, with respect to the inner tube 2, the powder core 3 and the outer tube 4.

However, the cladding tube 5 here is provided with a (circular) round outer cross-section. For this reason, the monofilament 1 is easy to manufacture. The cladding tube 5 is also produced of elementary copper and has a (circular) round inner cross-section.

Figure 3:
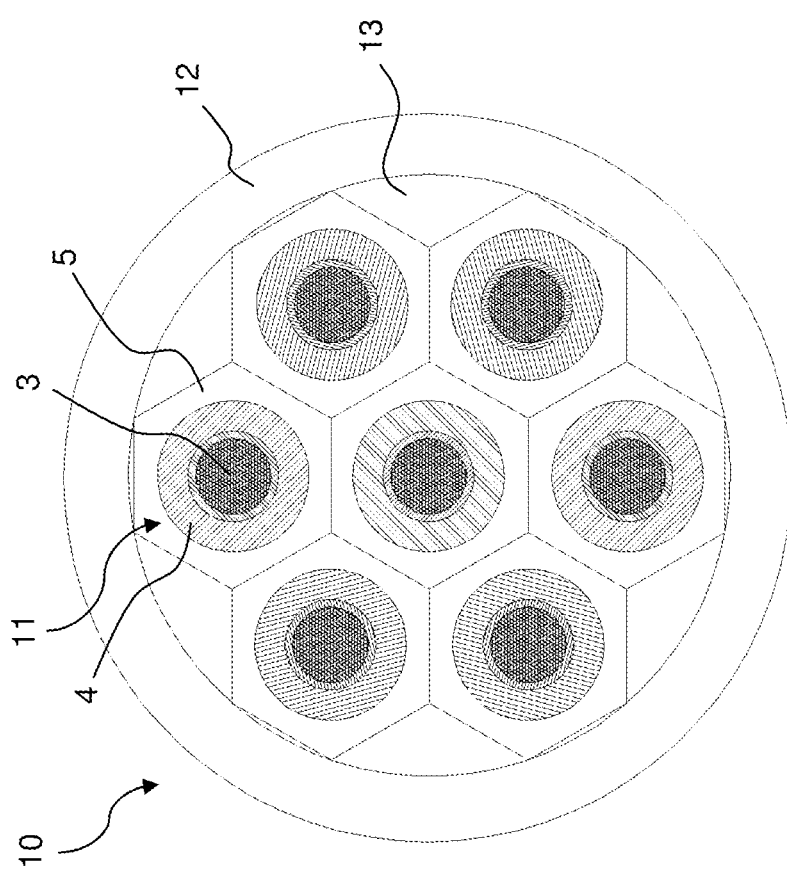
FIG. 3 shows a schematic cross-sectional view of an embodiment of an inventive precursor of a superconducting wire.

FIG. 3 shows a cross-section perpendicular to its longitudinal extension of an embodiment of an inventive precursor 10 of a superconducting wire.

A plurality of drawn monofilaments 11 (in the present case seven as an example), which are each produced from one monofilament by means of a filament drawing process, are bundled in a wire cladding tube 12 ("casing tube") in the precursor 10, and are subsequently subjected to an extrusion and/or wire drawing process in order to reduce the cross-section.

The wire cladding tube 12 is preferably produced of elementary copper. Cavities at the inner edge of the wire cladding tube 12 are prevented or filled by means of filling profiles 13 which are preferably produced of elementary copper.

In the present case, the monofilaments had a hexagonal outer cross-section (see FIG. 1) already prior to the filament drawing process such that the monofilaments were only radially compressed during the filament drawing process. The outer tubes 4 in the drawn monofilaments 11 correspondingly still have a round outer cross-section. The round outer cross-section of each outer tube 4 is maintained even after the extrusion and/or wire drawing process of the precursor 10. For this reason, starting from the powder core 3, the reaction front of $Nb_3Sn$ can uniformly and concentrically approach the outer edge of the outer tube 4 during reaction annealing. There are no particularly thin points where Sn could prematurely break through into the cladding tube 5. Nor are there particularly thick points where residual Nb not utilized for the reaction to $Nb_3Sn$ protrudes.

Figure 4:
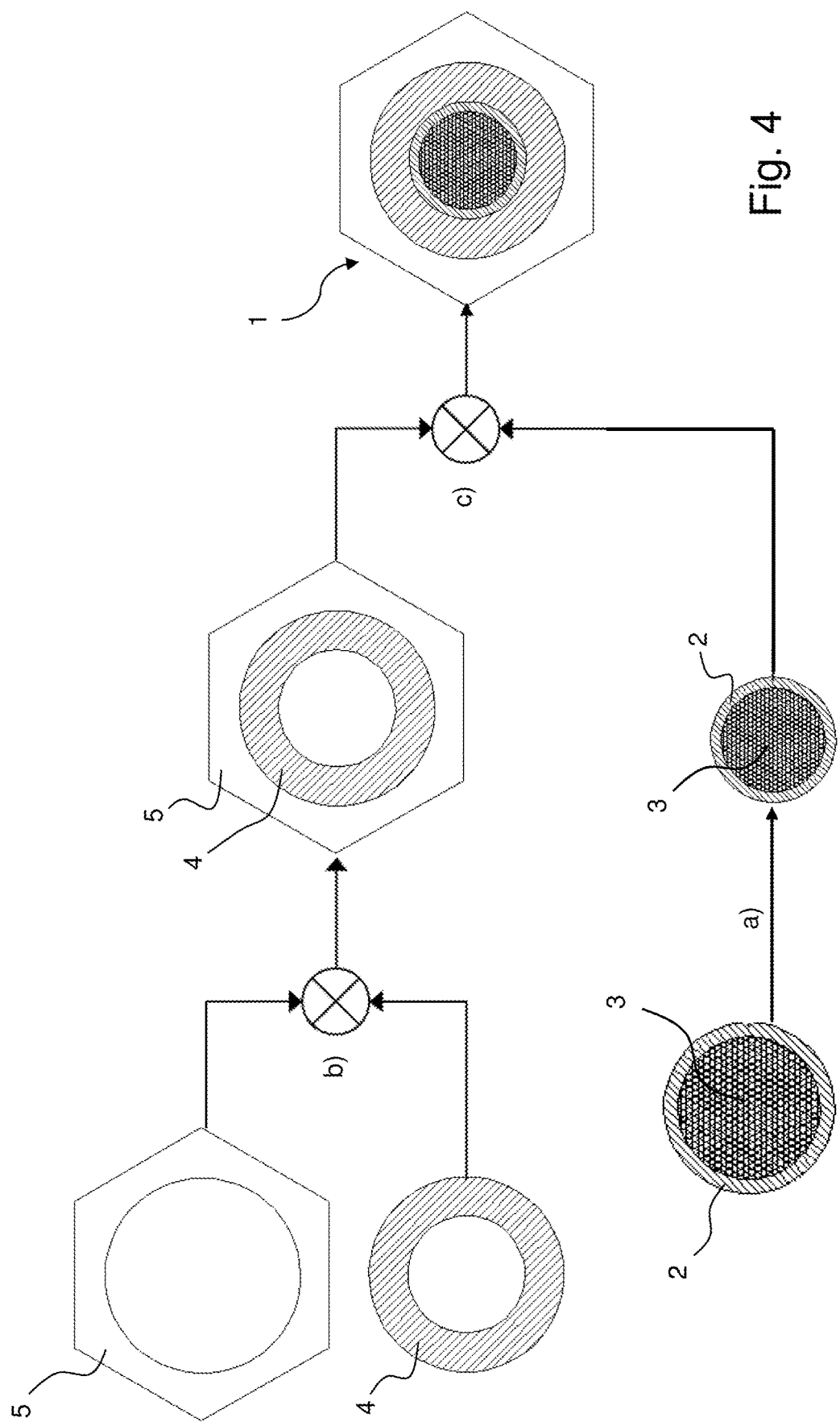
FIG. 4 shows a schematic diagram of the production of an inventive monofilament.

FIG. 4 shows a schematic diagram of the respective cross-sections of the specified components for producing an inventive monofilament 1.

Within the scope of the production variant illustrated here, the inner tube 2 is filled with the powder core 3 and subjected to a drawing step a). The cross-section of the comparatively thin-walled inner tube 2 is thereby reduced and the powder core 3 is compacted. The non-filled outer tube 4 is furthermore inserted into the cladding tube 5 (in the present case of hexagonal outer cross-section) in one step b). The steps a) and b) can thereby be performed in arbitrary order or also simultaneously. In step c), the drawn and filled inner tube 2 is subsequently introduced into the outer tube 4 which is already arranged in the cladding tube 5.

Alternatively, the drawn and filled inner tube may also be initially inserted into the outer tube and the outer tube can subsequently be inserted into the cladding tube (not separately shown).

Figure 5:
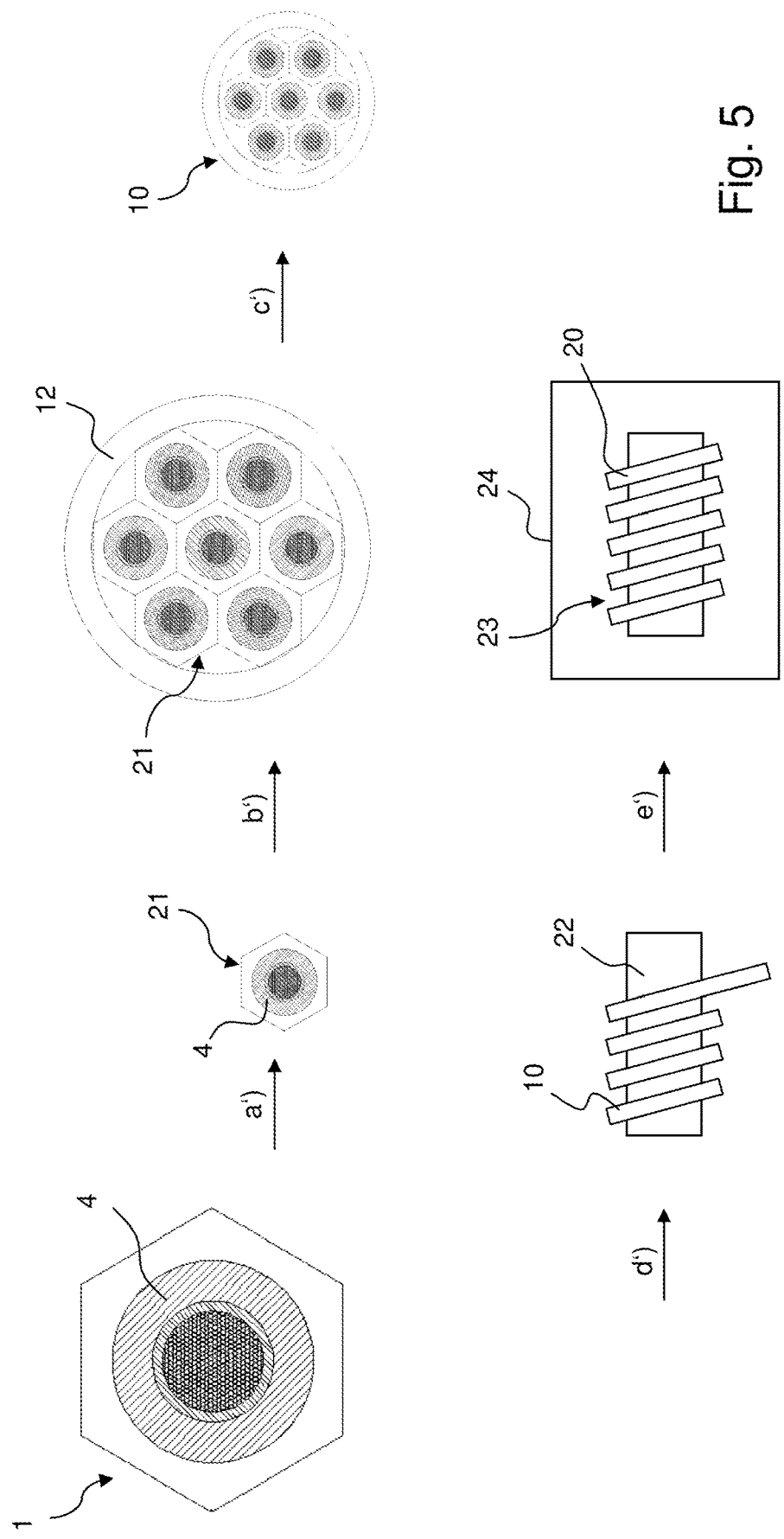
FIG. 5 shows a schematic diagram of the production of an inventive superconducting wire.

FIG. 5 schematically illustrates the production process of a superconducting wire 20 from monofilaments 1 as produced e.g. in accordance with FIG. 4.

A monofilament 1 is transformed into a drawn monofilament 21 by drawing in step a') ("filament drawing process"). The cross-sectional surface area is thereby reduced. If the monofilament 1 already has a hexagonal outer cross-section (as illustrated in FIG. 5), drawing merely effects radial compression. This is preferred since in this case, a round outer cross-section of the outer tube 4 can be easily obtained after drawing. If the monofilament 1 has a non-hexagonal outer cross-section (e.g. a round outer cross-section) a hexagonal outer cross-section is also impressed during drawing according to a').

A plurality of drawn monofilaments 21 are then bundled in a wire cladding tube 12 in step b'). The number of drawn monofilaments is thereby basically arbitrary. Seven drawn monofilaments 21 are bundled in the illustrated variant. In the bundled configuration, the monofilaments in the core area can be replaced by hexagonal Cu elements.

Extrusion and/or drawing is subsequently performed in step c') ("wire drawing process") which is again accompanied by a reduction in cross-section, thereby obtaining a precursor 10 of a superconductor. This precursor 10 already has the cross-sectional shape and cross-sectional size of the subsequent superconducting wire but can still be plastically deformed.

For finishing the superconducting wire, the precursor 10 must be shaped in step d') so as to have the shape required for the superconducting wire as determined by the desired application. In the illustrated variant, the application concerns a magnet coil 23. The precursor 10 is correspondingly wound onto a carrier 22.

Temperature treatment ("reaction annealing") of the formed precursor is subsequently carried out in step e'). Towards this end, the magnet coil 23 is put into a furnace 24 that is heated to a temperature of maximally 700° C. Sn from the powder cores reacts with Nb of the inner and outer tubes in the monofilaments of the precursor to $Nb_3Sn$ at these temperatures. Temperature treatment is terminated before the reaction front reaches the outer edge of the outer tubes. The formed precursor has been transformed into a superconducting wire 20 by means of the temperature treatment, the $Nb_3Sn$ filaments of which can carry an electrical current (with corresponding cooling e.g. with liquid helium) practically without ohmic losses. The superconducting wire 20 should not be deformed again after temperature treatment in order to prevent breaking of the enclosed brittle $Nb_3Sn$ filaments.

Figure 6:
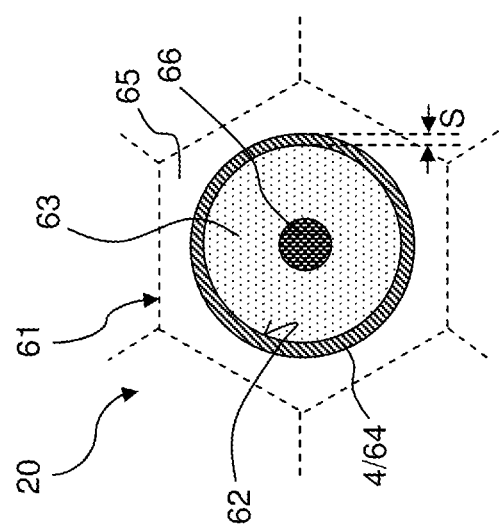
FIG. 6 shows a schematic cross-sectional view of a section of an inventive superconducting wire in the area of a monofilament.

FIG. 6 is a schematic cross-section illustrating a section of the superconducting wire 20 in the area of a temperature-treated monofilament 61.

A reaction front 62 has radially advanced from the inside to the outside in a temperature-treated monofilament 61 and has generated a relatively homogeneous fine-grained area 63 of $Nb_3Sn$. The reaction front 62, however, has not completely crossed the outer tube 4 but has left a circumferential border 64 of non-reacted material of the outer tube 4 (in the present case of NbTa7.5, i.e. Nb with 7.5 weight % Ta). The border 64 has an approximately uniform thickness S over its entire circumference. The thickness S is adjusted by the temperature treatment program to be just sufficiently large in order to reliably prevent breakthrough of Sn into the matrix 65 (formed from previous cladding tubes) of copper, thereby maintaining the electrical conductivity of the matrix 65 at a high level. Due to the round outer cross-section of the outer tube 4, a large portion of the cross-sectional area of the superconducting wire 20 can react to $Nb_3Sn$. In particular, there are no remaining useless bulges of material of the outer tube 4 (as would be generated at the edges of an outer tube having an outer hexagonal cross-section). Accordingly, Nb from the inner tube and the outer tube reacts with Sn from the powder core to form $Nb_3Sn$ via a reaction front which advances substantially through an entire radial extent of the outer tube.

The round outer cross-section of the outer tube 4 can already be obtained prior to drawing of the monofilaments (see step a') in FIG. 5) through a hexagonal outer cross-section of the cladding tubes.

A residual core 66 resulting from the powder core with a reduced amount of Sn generally remains in the temperature-treated monofilament 61.

The temperature-treated monofilament 61 is substantially free of gaps and cavities

LITERATURE

A.C.A. van Wees et al., IEEE Trans. Magn.; MAG 19, 556 (1983), pages 5-8;
H. Veringa et al., Adv. Cryo. Eng. (Materials), 1984, 30; 813-821;
W. L. Neijmeijer, B. H. Kolster, Journal of Less-Common Metals, 160 (1990), 161-170;
EP 1 701 390 A2
U.S. Pat. No. 3,926,683
T. Wong, C. V. Renaud, IEEE Trans. Appl. Supercond., Vol. 11, No. 1, March 2001, 3584-3587;
JP 2006 252949 A
US 2009/0011941 A1
EP 0 169 596 A1
S. Murase et al., IEEE Trans. Magn., Vol. Mag-21, No. 2, March 1985, pages 316-319;
DE 26 20 271 A1
D. Rodrigues Jr. et al., Materials Research Vol. 3, No. 4, 2000, pages 99-103;
JP 05 298 947 A
JP 2004 193019 A
JP 05 290 655 A
J. F. Kunzler et al., Phys. Rev. Lett. 6 (1961), pages 89-97;
J. D. Elen et al., IEEE Trans. Magn., MAG-13 (1977), No. 1, pages 470-473;

I claim:

1. A method for producing a superconducting wire having Nb$_3$SN superconductor from a monofilament and a precursor, the monofilament comprising:
a powder core that contains at least Sn and Cu;
an inner tube that encloses the powder core, the inner tube being made of Nb or of an alloy containing Nb;
an outer tube in which the inner tube is disposed, wherein an outer side of the inner tube is in contact with an inner side of the outer tube, the outer tube being made of Nb or of an alloy containing Nb; and
a cladding tube in which the outer tube is disposed, the inner tube having a round inner cross-section and a round outer cross-section and the outer tube having a round inner cross-section and a round outer-cross-section, wherein $4 \leq W_{outertube}/W_{innertube} \leq 50$ with $W_{outertube}$: wall thickness of the outer tube and $W_{innertube}$: wall thickness of the inner tube,
wherein the monofilament is produced by a method comprising the steps of:
a) filling the powder core into the inner tube;
b) drawing, following step a), the inner tube, thereby compacting the powder core;
c) inserting the outer tube into the cladding tube, and
d) inserting, following step b), the drawn, filled inner tube into the outer tube, wherein step c) is performed prior to or after step d),
the precursor being made by a method comprising the steps of:
e) drawing one or more of the monofilaments produced in step d) to produce monofilaments having a hexagonal outer cross-section;
f) bundling a plurality of drawn monofilaments in a wire cladding tube; and
g) extruding and/or drawing the wire cladding tube containing the bundled and drawn monofilaments, thereby obtaining the precursor of the superconducting wire,
and the superconducting wire is made from the precursor using the following steps:
h) mechanically deforming the precursor made in step g) or winding the precursor made in step g) to form a coil, and i) temperature-treating the deformed precursor or temperature-treating the deformed precursor at a maximum temperature of 700° C. or less, wherein Nb from the inner tube and the outer tube reacts with Sn from the powder core to form Nb$_3$SN.

2. The method of claim 1, wherein the cladding tube has a hexagonal outer cross-section and a round inner cross-section.

3. The method of claim 1, wherein $1.2 \leq D^{outside}_{outertube}/D^{outside}_{innertube} \leq 2.0$ with $D^{outside}_{outertube}$: outer diameter of the outer tube and $D^{outside}_{innertube}$: outer diameter of the inner tube.

4. The method of claim 1, wherein the powder core has a content of 2 weight % to 12 weight % of Cu, 3 to 9 weight % of Cu or the powder core contains elementary Cu powder.

5. The method of claim 1, wherein the powder core is compacted in the inner tube of has a density of at least 40% or of at least 50% of a theoretical density.

6. The method of claim 1, wherein the powder core contains NbSn$_2$ and or a Nb$_6$Sn$_5$ and/or elementary Sn.

7. The method of claim 1, wherein the inner tube and/or the outer tube are produced from an alloy containing Nb and containing Ta and/or Ti, have a summed content of at least 0.5 weight % of Ta and/or Ti or have a summed content of maximally 10 weight % Ta and/or Ti.

8. The method of claim 1, wherein the inner tube and the outer tube are produced from different materials.

9. The method of claim 1, wherein the cladding tube is made of Cu.

10. The method of claim 1, wherein the cladding tube already has a hexagonal outer cross-section prior to step c).

11. The method of claim 1, wherein, in step e), the monofilaments already have a hexagonal outer cross-section of the cladding tube and a round outer cross-section of the outer tube prior to drawing, wherein the drawn monofilaments also have a hexagonal outer cross-section of the cladding tube and a round outer cross-section of the outer tube after drawing.

12. A method for producing a superconducting wire having Nb$_3$SN superconductor from a monofilament and a precursor, the monofilament comprising:
a powder core that contains at least Sn and Cu;
an inner tube that encloses the powder core, the inner tube being made of Nb or of an alloy containing Nb;
an outer tube in which the inner tube is disposed, wherein an outer side of the inner tube is in contact with an inner side of the outer tube, the outer tube being made of Nb or of an alloy containing Nb; and
a cladding tube in which the outer tube is disposed, the inner tube having around inner cross-section and a round outer cross-section and the outer tube having a round inner cross-section and a round outer-cross-section, wherein $4 \leq W_{outertube}/W_{innertube} \leq 50$ with $W_{outertube}$: wall thickness of the outer tube and $W_{innertube}$: wall thickness of the inner tube,
wherein the monofilament is produced by a method comprising the steps of:
a) filling the powder core into the inner tube;
b) drawing, following step a), the inner tube, thereby compacting the powder core;

c) inserting the outer tube into the cladding tube, and d) inserting, following step b), the drawn, filled inner tube into the outer tube, wherein step c) is performed prior to or after step d), the precursor being made by a method comprising the steps of:

e) drawing one or more of the monofilaments produced in step d) to produce monofilaments having a hexagonal outer cross-section;

f) bundling a plurality of drawn monofilaments in a wire cladding tube; and g) extruding and/or drawing the wire cladding tube containing the bundled and drawn monofilaments, thereby obtaining the precursor of the superconducting wire, and the superconducting wire is made from the precursor using the following steps:

h) mechanically deforming the precursor made in step g) or winding the precursor made in step g) to form a coil, and i) temperature-treating the deformed precursor or temperature-treating the deformed precursor at a maximum temperature of 700° C. or less, wherein Nb from the inner tube and the outer tube reacts with Sn from the powder core to form $Nb_3Sn$, wherein Nb from the inner tube and the outer tube reacts with Sn from the powder core to form $Nb_3Sn$ via a reaction front which advances substantially through an entire radial extent of the outer tube.

13. The method of claim 12, wherein temperature treatment is terminated in step i) before the reaction front has reached a boundary surface between the outer tube and the cladding tube.

* * * * *